(12) United States Patent
Berlin et al.

(10) Patent No.: US 7,269,017 B2
(45) Date of Patent: Sep. 11, 2007

(54) THERMAL MANAGEMENT OF SURFACE-MOUNT CIRCUIT DEVICES ON LAMINATE CERAMIC SUBSTRATE

(75) Inventors: Carl W. Berlin, West Lafayette, IN (US); Dwadasi Hara Rama Sarma, Kokomo, IN (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 283 days.

(21) Appl. No.: 10/904,631

(22) Filed: Nov. 19, 2004

(65) Prior Publication Data
US 2006/0109632 A1 May 25, 2006

(51) Int. Cl.
*H05K 7/20* (2006.01)
(52) U.S. Cl. ............... 361/719; 165/80.3; 165/185; 257/707; 257/713; 361/707
(58) Field of Classification Search ............... 361/719
See application file for complete search history.

(56) References Cited

U.S. PATENT DOCUMENTS

| | | | |
|---|---|---|---|
| 5,113,315 A | | 5/1992 | Capp. et al. |
| 5,708,566 A | * | 1/1998 | Hunninghaus et al. ...... 361/704 |
| 5,721,454 A | | 2/1998 | Palmer |
| 5,896,271 A | * | 4/1999 | Jensen et al. ............... 361/719 |
| 5,909,085 A | * | 6/1999 | Nelson ......................... 315/94 |
| 5,990,550 A | * | 11/1999 | Umezawa ................... 257/712 |
| 6,058,013 A | * | 5/2000 | Christopher et al. ........ 361/704 |
| 6,212,076 B1 | * | 4/2001 | MacQuarrie et al. ....... 361/720 |
| 6,219,243 B1 | * | 4/2001 | Ma et al. ..................... 361/704 |
| 6,226,183 B1 | * | 5/2001 | Weber et al. ................ 361/704 |
| 6,282,094 B1 | * | 8/2001 | Lo et al. ...................... 361/704 |
| 6,477,054 B1 | * | 11/2002 | Hagerup ..................... 361/720 |
| 6,525,942 B2 | * | 2/2003 | Huang et al. ................ 361/704 |
| 7,084,511 B2 | * | 8/2006 | Matsuda ..................... 257/775 |
| 7,138,711 B2 | * | 11/2006 | Yee et al. .................... 257/720 |

(Continued)

FOREIGN PATENT DOCUMENTS

AU 2003/291243 6/2004

(Continued)

OTHER PUBLICATIONS

EP Search Report dated Aug. 18, 2006.

*Primary Examiner*—Gregory D Thompson
(74) *Attorney, Agent, or Firm*—Jimmy L. Funke

(57) ABSTRACT

A circuit board assembly with a substrate having a laminate construction of ceramic layers, such as an LTCC ceramic substrate. The substrate is configured for the purpose of improving the thermal management of power circuit devices mounted to the substrate. Thermally-conductive vias extend through the substrate from a first surface thereof to a second surface thereof. A circuit device is mounted to the first surface of the substrate and is electrically interconnected to conductor lines of the substrate. The device is also thermally coupled to the thermally-conductive vias with a first solder material. A heat sink located adjacent the second surface of the substrate is bonded to the thermally-conductive vias with a second solder material, such that the first solder material, the thermally-conductive vias, and the second solder material define a thermal path from the device to the heat sink.

20 Claims, 3 Drawing Sheets

U.S. PATENT DOCUMENTS

| | | |
|---|---|---|
| 2002/0034066 A1 | 3/2002 | Huang et al. |
| 2002/0057558 A1 | 5/2002 | Barrow |
| 2004/0037044 A1 | 2/2004 | Cook et al. |
| 2004/0196635 A1* | 10/2004 | Park et al. .................. 361/707 |

FOREIGN PATENT DOCUMENTS

| | | |
|---|---|---|
| DE | 19910500 | 10/2000 |
| EP | 0871352 | 10/1998 |

* cited by examiner

THERMAL MANAGEMENT OF SURFACE-MOUNT CIRCUIT DEVICES ON LAMINATE CERAMIC SUBSTRATE

BACKGROUND OF THE INVENTION

The present invention generally relates to thermal management of electronic circuit components. More particularly, this invention relates to promoting heat transfer from a surface-mount circuit device to a heat sink through direct attachment of thermal vias to the heat sink.

A variety of approaches are known for dissipating heat generated by semiconductor devices, such as integrated circuit (IC) chips. In the case of high-power IC chips, such as power flip chips, substrates of choice are typically formed of ceramic materials, such as alumina ($Al_2O_3$), which have higher thermal conductivities than printed circuit board (PCB) materials.

Laminate-type ceramic substrates known as low temperature co-fired ceramics (LTCC) have a number of process-related advantages over conventional ceramic substrates. LTCC substrates are conventionally made up of multiple green tapes containing a mixture of glass and ceramic fillers in an organic binder. The tapes are collated (stacked), laminated, and then fired (co-fired), during which the organic binders within the laminate stack are burned off and the remaining materials form, according to the combined composition, a monolithic ceramic substrate. Though having the above-noted processing advantages, LTCC substrates have relatively low thermal conductivities, typically about 3 W/mK as compared to about 20 W/mK for alumina. Consequently, LTCC substrates have been formed with green tapes containing a metal powder to promote heat dissipation through the substrate. However, a limitation of this approach is that the resulting metal-containing layers of the LTCC substrate are also electrically conductive to some degree.

In applications where individual layers of an LTCC substrate are to carry conductor patterns, resistors, etc., thick-film pastes for these components are often printed using screen printing techniques on individual tapes prior to collating and laminating the tapes. The tapes, along with their conductive, dielectric, and resistive pastes, are then co-fired, during which the binders of these pastes burn off to yield conductors, dielectrics, and resistors on and within the substrate. Because circuit components and their associated interconnect vias within an LTCC substrate generally necessitate that the ceramic layers they contact are nonconductive, improved thermal conductivity cannot be obtained by the use of metal-containing ceramic layers. A solution to this problem is represented in FIG. 1, and involves forming multiple thermal vias 116 through the thickness of an LTCC substrate 110 to conduct heat in a vertical direction from a die-and-wire type power chip 114. The thermal vias 116 are formed by punching vias in each green tape and then filling the vias prior to printing the conductors, resistors, etc. Interconnect vias 118 required to electrically interconnect components on different layers of the LTCC substrate 110 can be formed and filled at the same time as the thermal vias 116. The tapes are then laminated so that the filled vias are aligned to form through-vias, after which the tapes are fired such that the via fill material is co-fired along with conductor and resistor materials printed on surfaces of individual tapes. The entire LTCC substrate 110 (composed of bonded ceramic layers 112) is then bonded with a nonelectrically-conductive adhesive 120 to a heat sink 122 so that the thermal vias 116 conduct heat from the chip 114 to the heat sink 122.

While able to promote the conduction of heat away from power devices, thermal vias in an LTCC substrate do not provide heat spreading because of their through-thickness orientation. Furthermore, thermal vias may be inadequate to achieve suitable thermal management of certain power devices, particularly devices of the flip-chip type. For example, thermal vias alone can be inadequate because the solder bumps of a flip-chip device provide the primary thermal path from the device, and consequently the number of vias is limited by the number of solder bumps and the configuration of the solder bump pattern. In addition, the use of thermal vias is complicated by the fact that the solder bumps usually require electrical isolation as a result of also providing the electrical connection between the device and the substrate.

In view of the above, further improvements would be desirable for thermal management of power IC's, and particularly flip-chip power IC's, on LTCC substrates.

BRIEF SUMMARY OF THE INVENTION

The present invention provides a circuit board assembly comprising a substrate having a laminate construction of ceramic layers, such as an LTCC ceramic substrate. The substrate is configured for the purpose of improving the thermal management of power circuit devices mounted to the substrate.

The circuit board assembly includes a co-fired substrate comprising a plurality of ceramic layers bonded to each other and conductor lines on at least some of the ceramic layers so that some of the conductor lines are between adjacent pairs of the ceramic layers. Thermally-conductive vias extend through the substrate from a first surface thereof to a second surface thereof. A circuit device is mounted to the first surface of the substrate and is electrically interconnected to conductor lines of the substrate. The device is also thermally coupled to the thermally-conductive vias with a first solder material. A heat sink located adjacent the second surface of the substrate is bonded to the thermally-conductive vias with a second solder material, such that the first solder material, the thermally-conductive vias, and the second solder material define a thermal path from the device to the heat sink.

The substrate described above provides a more thermally conductive path between the device and heat sink than conventional ceramic laminate substrates in which bonding of the heat sink to the substrate is with a nonelectrically-conductive adhesive. The thermal path may include dielectric materials for electrical isolation of the thermal vias, so as to be particularly suitable for flip-chip power devices thermally coupled to an electrically conductive heat sink. Solder materials with different melting temperatures can be selectively used to permit sequential solder reflow attachment of the device and the heat sink. The invention also offers the potential for a low-cost, high-performance, reduced-size circuit assembly with the ability for CTE (coefficient of thermal expansion) matching between the substrate and heat sink. Finally, the above advantages of the invention can be achieved without changing any of the fundamental steps of the LTCC process. As such, the processing and structural advantages of LTCC substrates, including the ability to produce conductor lines and other circuit components by screen printing techniques, can be retained by the invention.

Other objects and advantages of this invention will be better appreciated from the following detailed description.

DETAILED DESCRIPTION OF THE INVENTION

Figure 2:
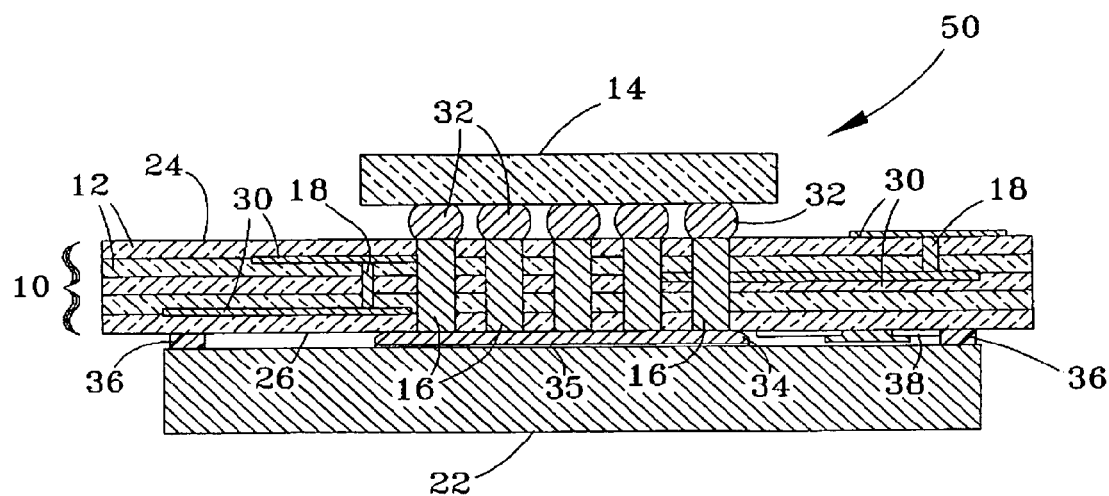
FIGS. 2, 3 and 4 show LTCC substrates in accordance with different embodiments of the present invention.

FIG. 2 depicts a circuit board assembly 50 in which a power flip chip 14 is mounted on a low-temperature co-fired ceramic (LTCC) substrate 10 in accordance with an embodiment of the present invention. As an LTCC, the substrate 10 is a monolithic structure made up of multiple ceramic layers 12 bonded to each other, with thick-film conductors 30 located on and within the substrate 10 between adjacent layers 12. As with known LTCC processes, the substrate 10 is fabricated using individual green tapes on which the thick-film conductor pastes are deposited which, after stacking and firing at a temperature of, for example up to abut 900° C., form the ceramic layers 12 and conductors 30, respectively. Other passive circuit components, such as resistors and capacitors, may also be fabricated within the substrate 10 in this manner. Also consistent with LTCC substrates of the past, conductors 30 on adjacent layers 12 are electrically interconnected with conductive interconnect vias 18. The vias 18 are preferably filled through-holes, wherein holes (vias) formed in the green tapes are filled with a suitable conductive material prior to stacking and firing the tapes. As with prior art LTCC substrates, each of the ceramic layers 12 preferably contains a mixture of electrically-nonconductive materials, typically glass and ceramic particles that, when fired, fuse to form a rigid monolithic structure. A suitable fired composition for the ceramic layers 12 include, by weight, about 30% to about 100% of a glass frit material such as $BaO—CaO—SiO_2—Al_2O_3—TiO_2$, with the balance being essentially a ceramic material such as $Al_2O_3$. Suitable thicknesses for the individual ceramic layers 12 are about 50 to about 250 micrometers, and a suitable thickness for the substrate 10 is about 250 to about 1000 micrometers.

The flip chip 14 is shown located on what will be termed the upper surface 24 of the substrate 10 (though it is understood that the substrate is not required to have any particular orientation). According to known flip chip processes, the flip chip 14 is electrically connected and physically attached to multiple conductors 30 on the upper surface 24 of the substrate 10 with solder bumps 32 located on the active frontside of the chip 14. The solder bumps 32 may be used to connect the chip 14 to the thermal vias 16, which are then electrically connected to certain conductors 30 within the substrate 10. Alternatively or in addition, the chip 14 can be connected with other solder bumps (not shown) to conductors 30 on the lower surface 26 of the substrate 10. Also in accordance with known flip chip practices, the flip chip 14 may be underfilled with a suitable underfill material (not shown) to reduce mechanical stresses on the solder bumps during a thermal cycle.

According to a preferred aspect of the invention, heat dissipated by the flip chip 14 is conducted away from the chip 14 to a heat sink 22 adjacent the lower surface 26 of the substrate 10. More particularly, and as shown in FIG. 2, the chip 14 is attached to thermal vias 16 that extend through the substrate 10 to its lower surface 26. The thermal vias 16 are defined by aligned holes (vias) through alt of the ceramic layers 12 of the substrate 10. The vias can be formed by, for example, punching the green tapes from which the ceramic layers 12 are formed. Each via is then filled with a suitable paste, such as silver, at the same time as the vias for interconnect vias 18. The tapes are then laminated so that the filled vias for the thermal vias 16 are aligned, such that firing of the tapes yields the individual thermal vias 16 as shown in FIG. 2.

In the embodiment represented in FIG. 2, solder bumps 32 directly attach the chip 14 to the thermal vias 16 at the upper surface 24 of the substrate 10, and a single solder layer 34 directly attaches the heat sink 22 to the thermal vias 16 at the lower surface 26 of the substrate 10, such that the chip 14 is thermally coupled to the heat sink 22 with an all-conductor (metallic) thermal path. In view of the solderability requirement of FIG. 2, preferred materials for the heat sink 22 include copper or one of its alloys, composites such as Cu/Mo/Cu, and copper-plated or nickel-plated aluminum, aluminum alloy, or steel, though other materials could foreseeably be used. To control the thickness and spreading of the solder layer 34, dielectric stand-offs 36 are preferably provided between the substrate 10 and heat sink 22. The stand-offs 36 can be formed by printing a suitable dielectric paste on the green tape that will form the surface 26 of the substrate 10. Suitable stand-offs can also be formed as surface features formed on the heat sink 22, such as when the heat sink 22 is formed by stamping. A suitable thickness for the solder layer 34 and suitable heights for the stand-offs 36 are in a range of about 0.25 to about 1.0 millimeter.

The solder material for the solder layer 34 is preferably a lower-melting composition than the solder material used to form the solder bumps 32, so that reflowing the solder layer 34 to attach the heat sink 22 does not result in reflowing of the solder bumps 32 that attach the chip 14. For this purpose, a suitable solder material for the solder bumps 32 is the eutectic Sn—Pb composition 63Sn/37Pb (melting temperature of about 183° C.), and a suitable solder material for the solder layer 34 is indium (melting temperature of about 157° C.), though it should be understood that a variety of other solder materials could be used.

In addition to the power flip chip 14, other circuit devices can be mounted to the substrate 10. For example, circuitry 38 (which may include various passive and active devices) is shown as having been fabricated on the lower surface 26 of the substrate, so as to be between the substrate 10 and the heat sink 22.

In view of the above, the embodiment of FIG. 2 provides a thermal path entirely made up of thermally-conductive elements, namely, the solder bumps 32, the thermal vias 16, and the solder layer 34. As such, these elements provide a direct path for heat transfer between the chip 14 to the heat sink 22, such that the relatively poor heat transfer characteristics of the LTCC substrate 10 and adhesives conventionally used to bond heat sinks to LTCC substrates do not pose a limitation to the thermal management of the chip 14. Because the arrangement depicted in FIG. 2 provides an electrically conductive path from each solder bump 32 to the solder layer 34, current flow into the heat sink 22 is preferably prevented as a result of the bumps 32 being non-electric bumps or by providing a dielectric layer 35 between the solder layer 34 and the heat sink 22.

Figure 3:
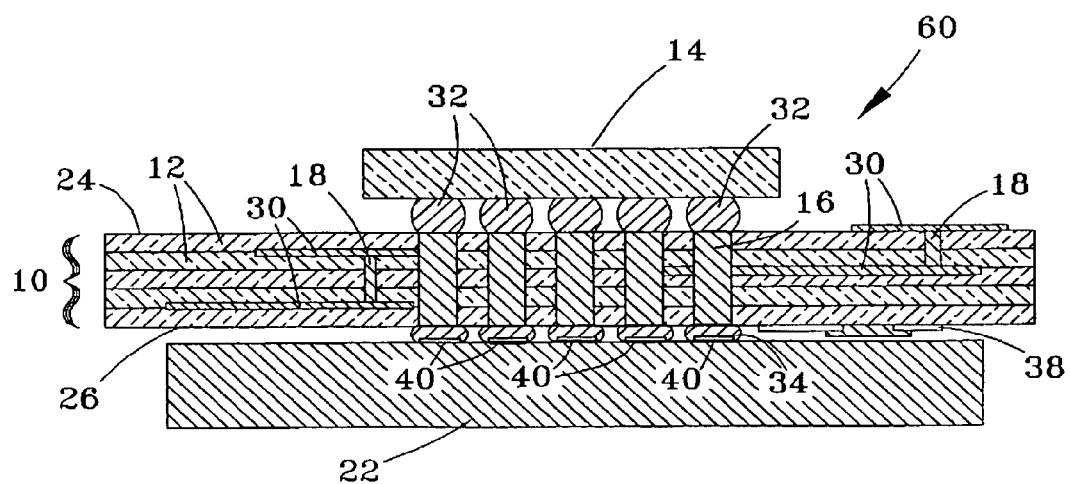

FIG. 3 depicts a circuit board assembly 60 in accordance with a second embodiment of the invention in which, for convenience, corresponding components are identified with the same reference numbers as those used in FIG. 2. As such, a power flip chip 14 is mounted on an LTCC substrate 10 made up of multiple ceramic layers 12. The embodiment of FIG. 3 differs in one aspect from FIG. 2 by the substitution of a nonmetallic (nonelectrically-conductive) heat sink 22 in FIG. 3 for the metallic (electrically-conductive) heat sink 22 of FIG. 2. Another difference apparent from FIG. 3 is the use of multiple solder bumps 34 in FIG. 3 instead of the single solder layer 34 of FIG. 2 to bond the heat sink 22 to the substrate 10. As with the embodiment of FIG. 2, the solder material for the solder bumps 34 is preferably a lower-melting material composition than the solder material used to form the solder bumps 32, so that reflowing the solder bumps 34 to attach the heat sink 22 does not result in reflowing of the solder bumps 32.

In view of the poor solderability of nonmetallic materials suitable for the heat sink 22, a solderable bond pad 40 is formed on the heat sink 22 for each of the solder bumps 34. Suitable materials for the bond pads 40 include copper and silver. Because solder materials tend to coalesce on the bond pads 40 to form the characteristic bump shape depicted in FIG. 3, the stand-offs 36 required by the embodiment of FIG. 2 are not required in FIG. 3 unless the weight of the substrate 10 makes additional support desirable. The embodiment of FIG. 3 provides multiple electrically and thermally conductive paths between the chip 14 and heat sink 22, with electrical isolation between the solder bumps 32 of the chip 14 being achieved as a result of the nonconductive material of the heat sink 22.

Figure 4:
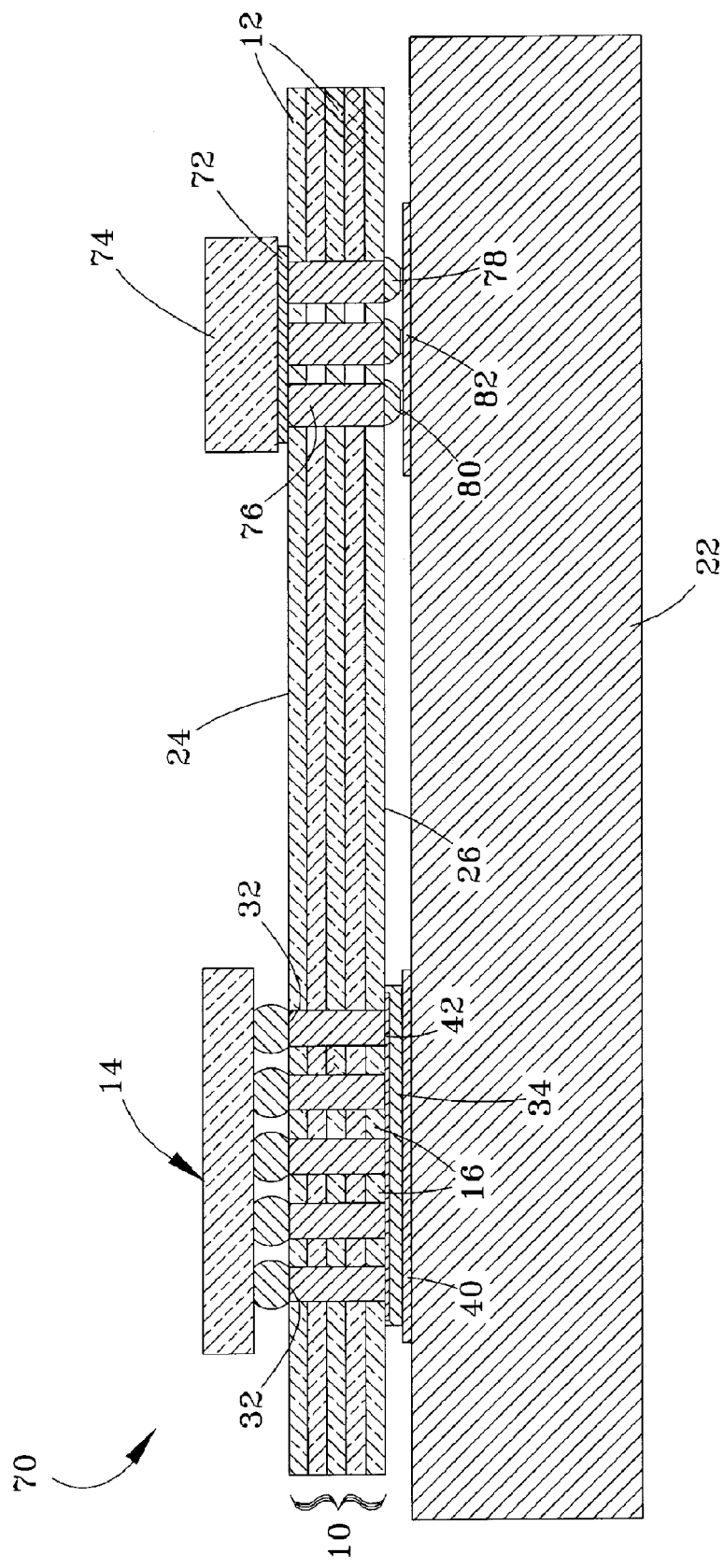

Finally, FIG. 4 depicts a circuit board assembly 70 in accordance with a third embodiment of the invention in which, again for convenience, corresponding components are identified with the same reference numbers as those used in FIG. 2. As such, the assembly 70 includes an LTCC substrate 10 made up of multiple ceramic layers 12, a power flip chip 14 on one surface 24 of the substrate 10, and a heat sink 22 attached to the opposite surface 26 of the substrate 10. As in FIG. 2, the heat sink 22 is formed of an electrically-conductive material, such as aluminum. The embodiment of FIG. 4 differs in several aspects from the embodiment of FIG. 2. For example, the thermal vias 16 for the flip-chip 14 are physically and thermally coupled to the heat sink 22 with a three-layer system comprising a thick-film conductor layer 42, a single solder layer 34, and a single bond pad 40. The conductor layer 42 serves to spread heat and provide a solderable surface, while the bond pad 40 serves to provide a solderable region on the otherwise nonsolderable aluminum heat sink 22. Suitable materials for the conductor layer 42 include silver or copper, while suitable materials for the bond pad 40 include thermal-sprayed copper. As with the embodiment of FIG. 2, the thermal vias 16 provide electrically conductive paths from the solder bump 32 to the solder layer 34 (through the conductor layer 42). As such, current flow into the heat sink 22 is avoided if the bumps 32 are non-electric bumps. Alternatively, a dielectric layer (not shown) can be provided between the solder layer 34 and the heat sink 22.

In addition to the above, FIG. 4 includes a surface-mount circuit device 74 that is not a flip chip, but instead is physically and electrically attached with a single solder layer 72 to a set of thermal vias 76 within the substrate 10. Multiple solder bumps 78 are employed to physically and thermally couple the thermal vias 76 to the heat sink 22 through a two-layer system comprising multiple bond pads 80 on a dielectric layer 82. The dielectric layer 82 provides electrical isolation between the device 74 and the heat sink 22, while the bond pads 80 serve to provide solderable regions on the otherwise nonsolderable dielectric layer 82. Suitable materials for the dielectric layer 82 include thermal-sprayed alumina, while suitable materials for the bond pads 80 include thermal-sprayed or thick-film copper. As with the previous embodiments, the solder materials for the solder layer 34 and solder bumps 78 are preferably lower-melting compositions than the solder materials used to form the solder bumps 32 and solder layer 72, to permit attachment of the heat sink 22 after attachment of the chip 14 and device 74. Notably, this configuration is illustrative of an approach in which a dielectric can be used to enable heat dissipation from a flip chip through electrically active bumps, as discussed in reference to the flip chips 14 of FIGS. 2 and 4.

Figure 1:
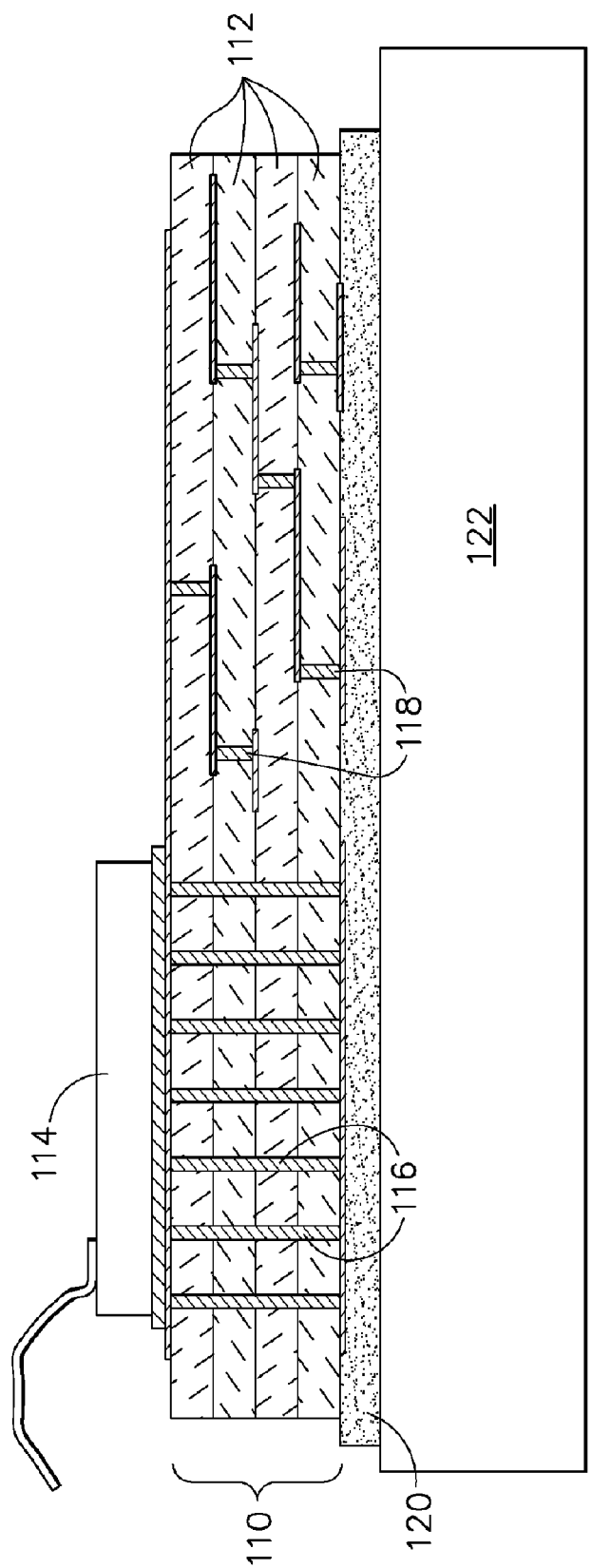
FIG. 1 shows an LTCC substrate with thermal vias in accordance with the prior art.

With each of the embodiments represented in FIGS. 2, 3, and 4, a desired effect is that the primary thermal path from a surface-mount circuit device is through thermally-conductive materials, including solder materials and metallic bond pads/layers. As such, the relatively poor heat transfer characteristics of adhesives conventionally used to bond heat sinks to LTCC substrates do not pose a limitation to the thermal management of power devices mounted to the substrate, and the maximum steady-state and transient temperatures of the devices can be significantly reduced in comparison to prior art LTCC substrates (FIG. 1).

Processes suitable for making the substrates 10 depicted in the Figures can be achieved without changing any of the fundamental steps of a conventional LTCC process. As such, such processes will not be described in any detail here. In a suitable process consistent with LTCC processes, individual green tapes are blanked from a green ceramic tape roll formulated to contain a binder along with the appropriate glass frit, ceramic, etc., so that when fired the tapes will yield the desired composition for the ceramic layers 12 of the substrate 10. Following blanking, the green tapes undergo via punching to yield vias for the interconnect vias 18 and through-hole vias for the thermal vias 16 and 76. The vias are then filled with a suitable conductive pastes, which on firing will yield the thermal and interconnect vias 16, 76, and 18. Thereafter, conductive paste is printed on the green tapes to form, on firing, the conductors 30. Suitable pastes can also be deposited at this time to form any thick-film resistors, capacitors, etc., required for the circuitry of the substrate 10. Conventional LTCC processing can then be performed, including collating and laminating the tapes, so that the tapes are superimposed, e.g., the vias for the thermal vias 16 and 76 are aligned. The resulting green substrate is then fired, during which the binders within the tapes and their components (e.g., vias 16, 76, and 18, conductors 30, etc.) are burned off and the remaining inorganic components are fused.

After conventional post-printing and post-firing process steps such as resistor trimming and electrical testing are carried out, the chip(s) 14, device(s) 74, and any other surface-mount devices are placed and reflow soldered to the surface 24 of the substrate 10. Thereafter, the heat sink 22 is reflow soldered to the thermal vias 16 and 76 at the lower surface 26 of the substrate 10.

While the invention has been described in terms of particular embodiments, it is apparent that other forms could be adopted by one skilled in the art. Accordingly, the scope of the invention is to be limited only by the following claims.

What is claimed is:

1. A circuit board assembly comprising:
   a co-fired substrate comprising a plurality of ceramic layers bonded to each other and conductor lines on at least some of the ceramic layers so that some of the conductor lines are between adjacent pairs of the ceramic layers, the co-fired substrate defining oppositely-disposed first and second surfaces;
   thermally-conductive vias extending through the substrate from the first surface to the second surface thereof;

a circuit device mounted to the first surface of the substrate, the device being electrically interconnected to the conductor lines of the substrate, the device being thermally coupled to the thermally-conductive vias with a connecting material;

a heat sink adjacent the second surface of the substrate;

a solder material bonding the heat sink to the thermally-conductive vias at the second surface of the substrate, the connecting material, the thermally-conductive vias, and the solder material defining a thermal path from the device to the heat sink; and wherein the thermal path prevents current flow therethrough into the heat sink.

2. A circuit board assembly according to claim 1, further comprising electrically-conductive vias that extend through at least some of the ceramic layers and electrically interconnect the conductor lines on adjacent pairs of the ceramic layers.

3. A circuit board assembly according to claim 1, wherein the connecting material thermally coupling the device to the thermally-conductive vias comprises multiple solder bumps.

4. A circuit board assembly according to claim 1, wherein the solder material thermally coupling the heat sink to the thermally-conductive vias comprises a single solder layer.

5. A circuit board assembly according to claim 4, wherein the heat sink is formed of an electrically-conductive material.

6. A circuit board assembly according to claim 5, further comprising a solderable region on the heat sink, and the single solder layer bonds the solderable region on the heat sink to the thermally-conductive vias.

7. A circuit board assembly according to claim 5, wherein the single solder layer directly bonds the heat sink to the thermally-conductive vias.

8. A circuit board assembly according to claim 5, further comprising a solderable layer on the heat sink, and the single solder layer is bonded to the solderable layer on the heat sink.

9. A circuit board assembly according to claim 1, wherein the solder material thermally coupling the heat sink to the thermally-conductive vias comprises multiple solder bumps.

10. A circuit board assembly according to claim 9, wherein the heat sink is formed of a dielectric material.

11. A circuit board assembly according to claim 10, further comprising multiple solderable pads on the heat sink, the multiple solder bumps bonding the multiple solderable pads on the heat sink to the thermally-conductive vias.

12. A circuit board assembly according to claim 9, wherein the heat sink is formed of an electrically-conductive material.

13. A circuit board assembly according to claim 12, further comprising multiple solderable pads on the heat sink, the multiple solder bumps bonding the multiple solderable pads on the heat sink to the thermally-conductive vias.

14. A circuit board assembly according to claim 12, further comprising a dielectric material electrically insulating the heat sink from the thermally-conductive vias.

15. A circuit board assembly according to claim 1, wherein the device is a flip chip device electrically interconnected to the conductor lines on the first surface of the substrate with multiple solder bumps.

16. A circuit board assembly according to claim 1, further comprising a circuit device on the second surface of the substrate and between the second surface and the heat sink.

17. A circuit board assembly according to claim 1, wherein the substrate is a low-temperature co-fired ceramic substrate.

18. A circuit board assembly comprising:

a low-temperature co-fired ceramic substrate comprising a plurality of ceramic layers bonded to each other and conductor lines on at least some of the ceramic layers so that some of the conductor lines are between adjacent pairs of the ceramic layers, the co-fired substrate defining oppositely-disposed first and second surfaces;

electrically-conductive vias that extend through at least some of the ceramic layers and electrically interconnect the conductor lines on adjacent pairs of the ceramic layers;

thermally-conductive vias extending through the substrate from the first surface to the second surface thereof;

a circuit device mounted to the first surface of the substrate, the device being electrically interconnected to the conductor lines on the first surface with multiple first solder bumps, the device being thermally coupled to the thermally-conductive vias with multiple second solder bumps;

a heat sink adjacent the second surface of the substrate;

a solder material bonding the heat sink to the thermally-conductive vias at the second surface of the substrate, the second solder bumps, the thermally-conductive vias, and the solder material defining a thermal path from the device to the heat sink; and wherein the thermal path prevents current flow therethrough into the heat sink.

19. A circuit board assembly according to claim 18, wherein the heat sink is formed of a dielectric material having a solderable region, and the solder material directly bonds the thermally-conductive vias to the solderable region on the heat sink.

20. A circuit board assembly according to claim 18, wherein the heat sink is formed of an electrically-conductive material, the solder material is bonded to a solderable region on the heat sink, and a dielectric material electrically insulates the heat sink from the thermally-conductive vias.

* * * * *